(12) United States Patent
Kusaka et al.

(10) Patent No.: US 11,698,583 B2
(45) Date of Patent: Jul. 11, 2023

(54) IMPRINT APPARATUS AND ARTICLE MANUFACTURING METHOD

(71) Applicant: CANON KABUSHIKI KAISHA, Tokyo (JP)

(72) Inventors: Atsushi Kusaka, Shimotsuke (JP); Hiroshi Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 345 days.

(21) Appl. No.: 16/270,851

(22) Filed: Feb. 8, 2019

(65) Prior Publication Data

US 2019/0250506 A1 Aug. 15, 2019

(30) Foreign Application Priority Data

Feb. 13, 2018 (JP) ................................. 2018-023406

(51) Int. Cl.
*B29C 43/02* (2006.01)
*G03F 7/00* (2006.01)

(52) U.S. Cl.
CPC ............ *G03F 7/0002* (2013.01); *B29C 43/02* (2013.01)

(58) Field of Classification Search
CPC . G03F 7/0002; G03F 9/00; G03F 7/00; B29C 43/02; B29C 43/22; B29B 17/00; B41K 1/42; B41F 33/00; H01L 21/304
See application file for complete search history.

(56) References Cited

U.S. PATENT DOCUMENTS

| | | | |
|---|---|---|---|
| 8,414,279 B2 * | 4/2013 | Kawakami | ............. B82Y 40/00 425/150 |
| 2010/0072649 A1 | 3/2010 | Kawakami et al. | |
| 2010/0236433 A1 * | 9/2010 | Cabrera | ................. B82Y 40/00 101/333 |
| 2013/0015599 A1 | 1/2013 | Kawahara | |
| 2015/0008605 A1 | 1/2015 | Sato | |

FOREIGN PATENT DOCUMENTS

| | | |
|---|---|---|
| JP | 2012129314 A | 7/2012 |
| JP | 2013021194 A | 1/2013 |
| JP | 2014241398 A | 12/2014 |
| JP | 2015029070 A | 2/2015 |
| JP | 2016018824 A | 2/2016 |

OTHER PUBLICATIONS

Office Action issued in Japanese Application No. 2018-023406 dated Jan. 7, 2022.

* cited by examiner

*Primary Examiner* — Galen H Hauth
*Assistant Examiner* — Shibin Liang
(74) *Attorney, Agent, or Firm* — Rossi, Kimms & McDowell LLP (57) ABSTRACT

An imprint apparatus is operable to perform an imprint process, which is for forming a pattern on an imprint material on a substrate by using a mold, for each of shot regions of the substrate. The apparatus includes a controller configured to control alignment between the mold and the substrate. The controller determines a target position obtained by adding a predetermined additional amount to a movement amount of a substrate stage according to a positional deviation between the mold and the substrate, starts movement of the stage towards the determined target position, and starts curing of the imprint material by a curing device at a timing at which the detected positional deviation falls within an allowable range during the movement of the stage.

11 Claims, 7 Drawing Sheets

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

An imprint apparatus forms a pattern on a substrate by curing an imprint material in a state in which a mold on which a pattern is formed and an imprint material on the substrate are brought into contact, and then separating the cured imprint material and the mold. In an imprint apparatus, as a method for curing an imprint material, typically a photo-curing method in which the imprint material on the substrate is cured by irradiation of light such as ultraviolet light is employed.

In an imprint apparatus, it is necessary to transfer the pattern of the mold at high accuracy at a predetermined position on the substrate in order to maintain the performance of the device. At that time, typically, alignment of the pattern on the substrate in relation to the mold is performed by driving a substrate stage or the like. For example, a technique in which a result of measurement by a scope or the like, which directly observes a relative position between the mold and the predetermined position on the substrate via the imprint material after the imprint material and the mold are brought into contact but prior to curing, is fed back to a drive command value for the stage or the like has been proposed (for example, refer to Japanese Patent Laid-Open No. 2016-018824).

In the case where the result of measurement by the scope, which is able to directly measure the relative position between the mold and the predetermined position on the substrate is fed back and then the stage is moved, there are cases in which oscillation occurs in the stage due to the control even after the relative position becomes a target value due to a cycle of the measurement or information transmission delay. The result of this is that there are cases in which oscillation remains in the scope measurement results. In the conventional art, there is a problem in that, since irradiation of light (curing of the imprint material) is performed at a decided timing even in a case where oscillation remains in the scope measurement results, alignment precision is degraded.

SUMMARY OF THE INVENTION

The present invention provides an imprint apparatus that is advantageous in terms of alignment precision, for example.

The present invention in its one aspect provides an imprint apparatus operable to perform an imprint process, which is for forming a pattern on an imprint material on a substrate by using a mold, for each of shot regions of the substrate, the apparatus comprising a movable stage configured to hold the substrate, a detector configured to detect a positional deviation between the mold and the substrate, a curing device configured to cure an imprint material on the substrate, and a controller configured to control alignment between the mold and the substrate and to control the curing device, wherein the controller is configured to determine a target position obtained by adding a predetermined additional amount to a movement amount of the stage according to the positional deviation detected by the detector, to start movement of the stage towards the determined target position, and to start curing of the imprint material by the curing device at a timing at which the positional deviation detected by the detector falls within an allowable range during the movement of the stage.

Further features of the present invention will become apparent from the following description of exemplary embodiments (with reference to the attached drawings).

DESCRIPTION OF THE EMBODIMENTS

Various exemplary embodiments, features, and aspects of the invention will be described in detail below with reference to the drawings.

Below, description is given in detail for embodiments of the present invention with reference to the drawings. Note that the following embodiments merely illustrate concrete examples of implementing the present invention, and the present invention is not limited to the following embodiments. In addition, not all combinations of characteristic features described in the following embodiments are essential to solve the problems in the present invention.

Firstly, an overview of an imprint apparatus according to an embodiment will be described. The imprint apparatus is an apparatus that brings an imprint material supplied onto a substrate into contact with a mold and supplies curing energy to the imprint material to form a pattern of the cured material to which a concave-convex pattern of the mold is transferred.

As an imprint material, a curable composition (to be sometimes called an uncured resin) that is cured upon application of curing energy is used. As curing energy, electromagnetic waves, heat, or the like can be used. Electromagnetic waves can be, for example, light selected from the wavelength range of 10 nm or more and 1 mm or less, for example, infrared light, visible light, or ultraviolet light, or the like. A curable composition can be a composition that is cured by being irradiated with light or by being heated. Of these compositions, a photo-curable composition that is cured by being irradiated with light contains at least a polymerizable compound and a photopolymerization initiator, and may further contain a non-polymerizable compound or a solvent, as needed. A non-polymerizable compound is at least one type of compound selected from the group consisting of a sensitizer, hydrogen donor, internal mold release agent, surfactant, antioxidant, and polymer component. An imprint material supply apparatus can arrange an imprint material on a substrate in the form of droplets or islands or films formed from a plurality of droplets connected to each other. The viscosity (the viscosity at 25° C.) of the imprint material can be, for example, 1 mPa·s or more and 100 mPa·s or less. As a material for a substrate, for example, glass, ceramic, metal, semiconductor, or resin can be used. The surface of a substrate may be provided with a member made of a material different from that of the substrate, as needed. For example, a silicon wafer, a compound semiconductor wafer, silica glass, or the like is used as the substrate.

Figure 1:
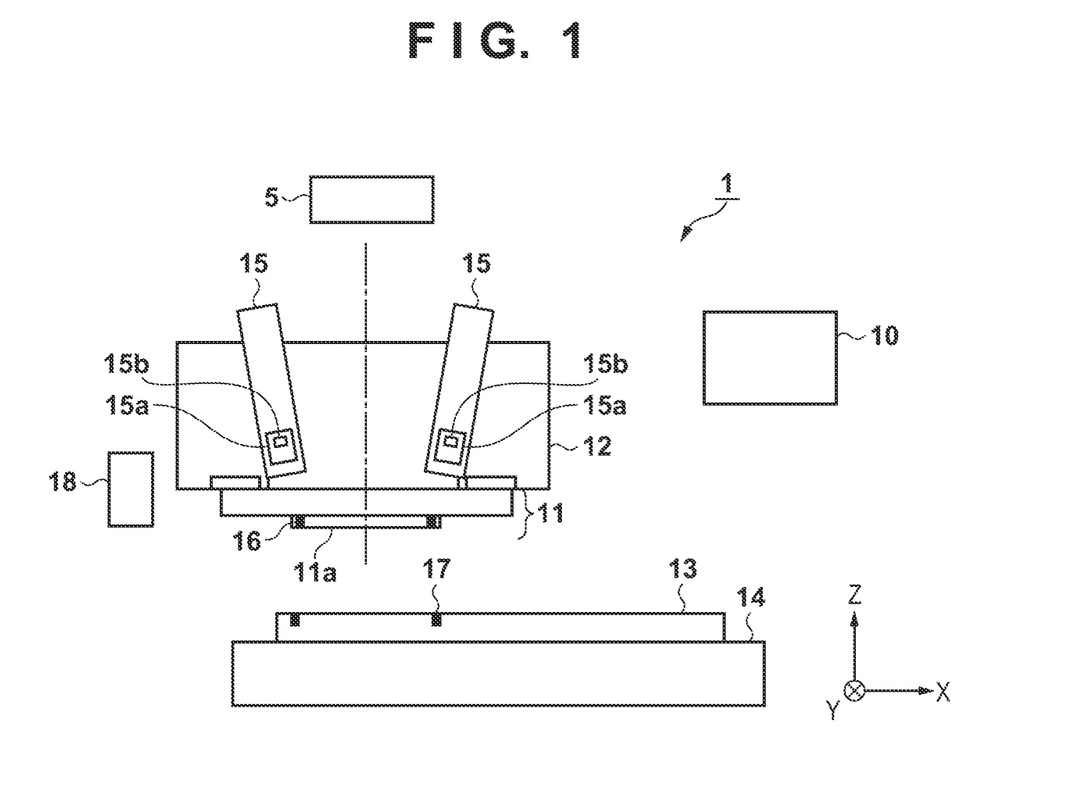
FIG. 1 is a view for illustrating a configuration of an imprint apparatus in an embodiment.

FIG. 1 is a schematic view for illustrating a configuration of an imprint apparatus 1 in the present embodiment. The imprint apparatus 1 performs an imprint process in which it forms a pattern on a substrate by curing an imprint material in a state in which a mold and an imprint material on the substrate are brought into contact, and then separating (releasing) the cured imprint material and mold. In the present embodiment, it is assumed that a photo-curing method in which the imprint material is cured by ultraviolet light irradiation is employed as the method of curing the imprint material. Note that in the present embodiment, description is given assuming that the X axis and the Y axis are in directions orthogonal to each other in a plane parallel to the surface of the substrate, and that the Z axis is in a direction that is orthogonal to the X axis and the Y axis.

The imprint apparatus 1 comprises a mold holder 12 for holding a mold 11, a substrate stage 14 (substrate holder) for holding a substrate 13 and moving, detectors 15 for detecting a positional deviation (position misalignment) between the mold and the substrate, an irradiator 5, a dispenser 18, and a controller 10. Also, the imprint apparatus 1 has a supporting body for supporting the dispenser 18, the mold holder 12, or the like, a base surface plate for supporting the substrate stage 14 (neither shown), and the like.

The mold 11 has a rectangle exterior shape, for example, in a plan view, and comprises a patterning surface 11a on which a pattern (concave-convex pattern) to be transferred to the imprint material on the substrate 13 is formed. The mold 11 is configured of a material that ultraviolet light for curing the imprint material on the substrate 13 can pass through such as quartz, for example. Also, on the patterning surface 11a of the mold 11, a mold-side mark 16 (a first mark) is formed.

The mold holder 12 may include, for example, a mold chuck for holding the mold 11 by vacuum adsorption or electrostatic adsorption, a mold stage on which to mount the mold chuck, and a driving system for driving the mold stage. The driving system drives the mold stage (and therefore the mold 11) in at least the Z-axis direction (the direction in which the mold 11 is brought into contact with and separated from the imprint material on the substrate). Also, the driving system may further have a function for driving the mold stage in the X-axis direction, the Y-axis direction, and θx (rotation about the X axis), θy (rotation about the Y axis), and θz (rotation about the Z axis) directions.

The substrate 13 is a substrate to which the pattern of the mold 11 is transferred, and for example, may be a single crystal silicon substrate, an SOI (Silicon On Insulator) substrate, or the like. Imprint material is supplied (applied) from the dispenser 18 (an imprint material supplier) to the substrate 13. Also, a substrate-side mark 17 (a second mark) is formed at each of the plurality of shot regions of the substrate 13.

The substrate stage 14 may include, for example, a substrate chuck for holding the substrate 13 by vacuum adsorption or electrostatic adsorption, a driving system for driving the substrate chuck, and a measurement system such as an encoder for measuring the stage position. The driving system drives the substrate stage 14 (and therefore the substrate 13) in at least the X-axis direction, the Y-axis direction, and the θz direction. Also, the driving system may further have a function for driving the substrate stage in the Z-axis direction, the θx direction, and the θz direction.

The dispenser 18, which is the aforementioned imprint material supply apparatus, supplies imprint material onto the substrate 13. The irradiator 5 (curing device) irradiates the imprint material with light (ultraviolet light) for curing imprint material on the substrate 13 via the mold 11. The controller 10 includes for example, a processor and a memory, and controls operation of each unit of the imprint apparatus 1, and in particular, in the present embodiment, performs control for aligning the mold and the substrate and controlling the irradiator 5.

The detectors 15 include a scope 15a for optically detecting (observing) the mold-side mark 16 provided on the mold 11 and the substrate-side mark 17 provided on each of the plurality of shot regions of the substrate 13. The scope 15a may detect an image of each of the mold-side mark 16 and the substrate-side mark 17, and may detect a moire pattern or the like produced by the mold-side mark 16 and the substrate-side mark 17. The scope 15a includes an image capture element 15b for converting light from the mold-side mark 16 and the substrate-side mark 17 into an electrical signal. The controller 10, by performing image processing on the result of detection by the scope 15a, can calculate the relative positional deviation between the mold 11 and the substrate 13. Note that the scope 15a need not be able to simultaneously detect the mold-side mark 16 and the substrate-side mark 17. For example, the controller 10 may calculate the relative positional relationship between the mold-side mark 16 and the substrate-side mark 17 by obtaining the positions of the mold-side mark 16 and the substrate-side mark 17 respectively in relation to a reference position arranged inside the detector 15.

Next, an overview of an imprint process by the imprint apparatus 1 will be described. The substrate stage 14 moves to a position at which to switch the substrate 13, and the substrate 13 is mounted to the substrate chuck on the substrate stage 14 by a substrate switching hand (not shown). The controller 10 moves the substrate stage 14 so that the shot region which is a region that is the target of the imprint process on the substrate 13 is below the dispenser 18, and supplies imprint material on the shot region of the substrate 13 by the dispenser 18. The controller 10, after moving the substrate stage 14 so that the shot region is positioned under the mold 11, lowers the mold 11 by the mold holder 12, and brings the mold 11 into contact with the imprint material on the substrate. By such contact, a gap between the mold 11 and the substrate 13 is, for example, 1 μm or less, and the imprint material is filled into this gap.

In the initial period of this contact, normally, a positional deviation occurs in the relative positioning for the horizontal directions (X direction and Y direction) between the mold 11 and the substrate 13. This positional deviation, as previously described, may be detected by the detector 15, and driving to align the substrate stage 14 (alignment) may be performed by control by the controller 10 so that this positional deviation is resolved.

After the alignment completes, the imprint material is cured by irradiating the imprint material with ultraviolet light by the irradiator 5. After the imprint material is cured, the mold holder 12 is raised to separate (release) the mold 11 from the imprint material, and one shot region's worth of imprint processing is completed. Thereafter, for each shot region, the sequence of supplying imprint material onto the substrate, bringing the mold and the imprint material into contact, aligning, curing of the imprint material, and releasing is repeated.

When the imprint process is finished for all of the substrate, the substrate stage 14 moves to the substrate switching position, and the substrate 13 for which imprinting has been completed is recovered by the substrate switching hand. After that, the substrate to be the next target of processing is mounted on the substrate chuck, and once again the imprint sequence for the full area of the substrate is executed.

The imprint process in the present embodiment is generally as explained above. Note that in the example described above, configuration is such that the substrate stage 14 is moved upon alignment between the mold 11 and the substrate 13, but configuration may be such that the mold holder 12 is moved in the X and Y directions. Alternatively, configuration may be such that both of the substrate stage 14 and the mold holder 12 are moved. However, the following description is premised upon a configuration in which the substrate stage 14 is moved when aligning the mold 11 and the substrate 13.

Figure 2:
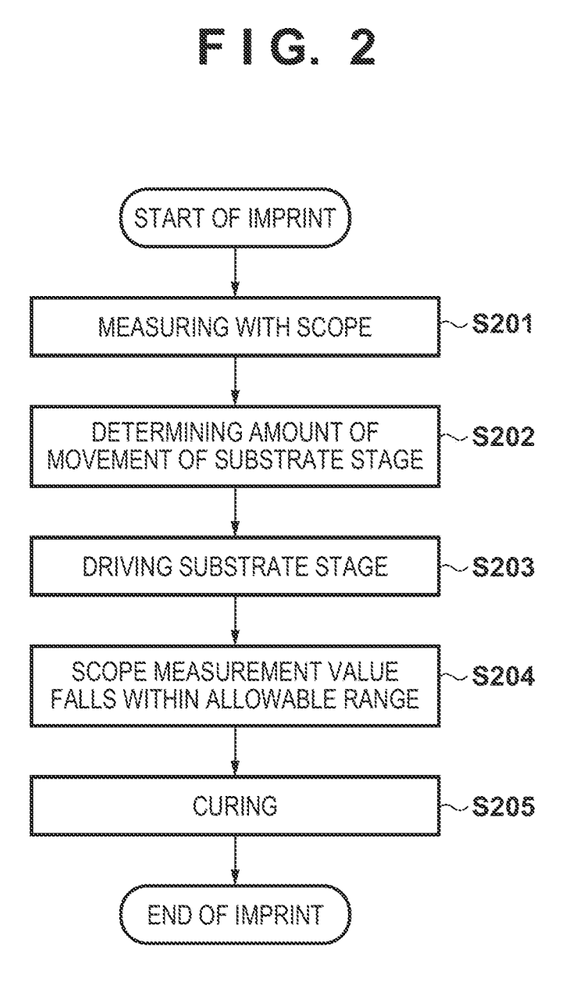
FIG. 2 is a flowchart for illustrating an imprint method of the embodiment.

FIG. 2 is a flowchart of an imprint method that illustrates an imprint process for one shot region in the present embodiment. In FIG. 2, processing, in the foregoing imprint process for one shot region, from when an imprint is started until when an imprint material is cured is illustrated. When the imprint is started, the mold 11 and the imprint material on the substrate 13 are brought into contact, the imprint material is filled into the mold-side mark 16 and the substrate-side mark 17, and both marks become observable. In this state, the controller 10 measures a positional deviation between the mold 11 and the substrate 13 by the scope 15a (step S201). Configuration may be taken to start observation prior to the imprint material being filled into the mold-side mark 16 and the substrate-side mark 17, if the state is such that observation is possible.

The controller 10 determines the movement amount of the substrate stage 14 so that a positional deviation is eliminated, based on the result of the measurement in step S201 (step S202). The controller 10 drives the substrate stage 14 in accordance with the determined movement amount (step S203). After that, at a timing at which the scope measurement value falls within an allowable range (step S204), the controller 10 causes light to be irradiated onto the imprint material on the substrate by the irradiator 5, and thereby cures the imprint material (step S205).

Figure 5:
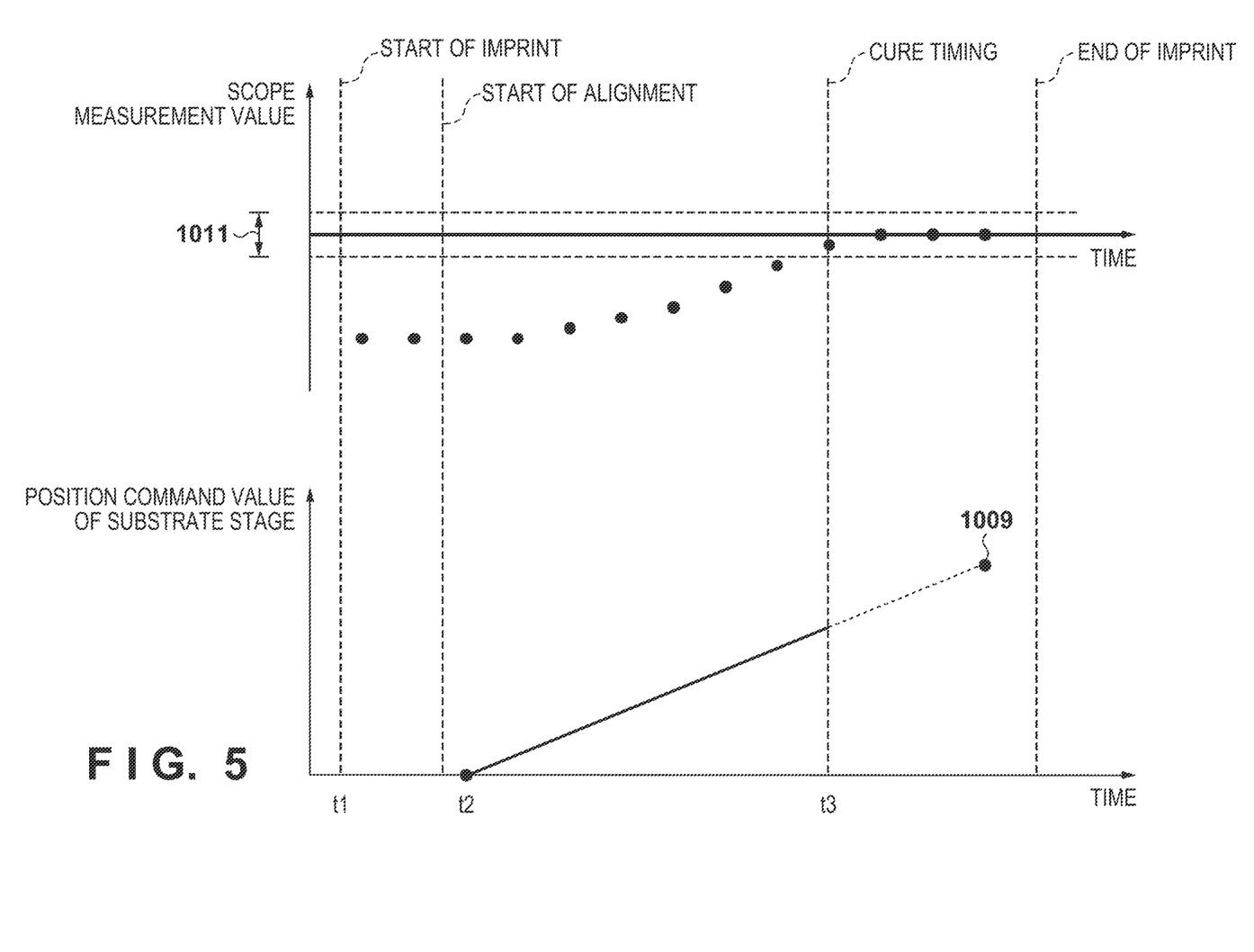
FIG. 5 is a temporal sequence view for describing an imprint alignment process in the embodiment.

FIG. 5 is a view for describing alignment processing during imprint processing following the flow of FIG. 2. In FIG. 5, the scope measurement values indicating a positional deviation between the mold 11 and the substrate 13 and the position command value of the substrate stage 14 are indicated in a temporal sequence. The imprint is started at time t1, and the mold 11 and the imprint material on the substrate 13 are brought into contact. Alignment is started when the relative position between the mold 11 and the substrate 13 becomes observable by the scope 15a. At that time, the controller 10 determines, from the scope measurement value, a target position 1009 of the substrate stage 14 in a direction for putting the relative position between the mold 11 and the substrate 13 in an ideal state. The target position 1009 is designated so as to pass over a point at which the relative position between the mold 11 and the substrate 13 is in an ideal state. In this way, the controller 10 determines the target position 1009 obtained by applying a predetermined additional amount to the movement amount of the substrate stage 14 according to the positional deviation detected by the detectors 15.

The controller 10, at time t2, starts movement of the substrate stage 14 towards the target position 1009. At that time, for driving of the substrate stage 14, a measurement result of a measurement system that can measure a substrate stage position is referenced, and a measurement result of the scope 15a that detects the relative position between the mold 11 and the substrate 13 is not referenced. Therefore, the controller 10 performs control of movement of the substrate stage 14 without feedback control that is based on the detection result by the detectors 15. Here, the controller 10 controls the substrate stage 14 using the result of measurement by a measurement system such as an encoder for measuring the position of the substrate stage 14, for example. Accordingly, it is possible to drive the substrate stage 14 without generating oscillation due to feed back of the scope measurement results (the result of detection by the detectors 15) in the driving of the substrate stage 14. By this, it is possible to guarantee good alignment precision and overlay accuracy. However, the scope 15a continues measuring even during the driving of the substrate stage 14. At the timing t3 where the scope measurement value falls within the allowable range 1011 during movement of the substrate stage 14, irradiation of ultraviolet light from the irradiator 5 is started, and the imprint material is cured.

Variation Example

Figure 3:
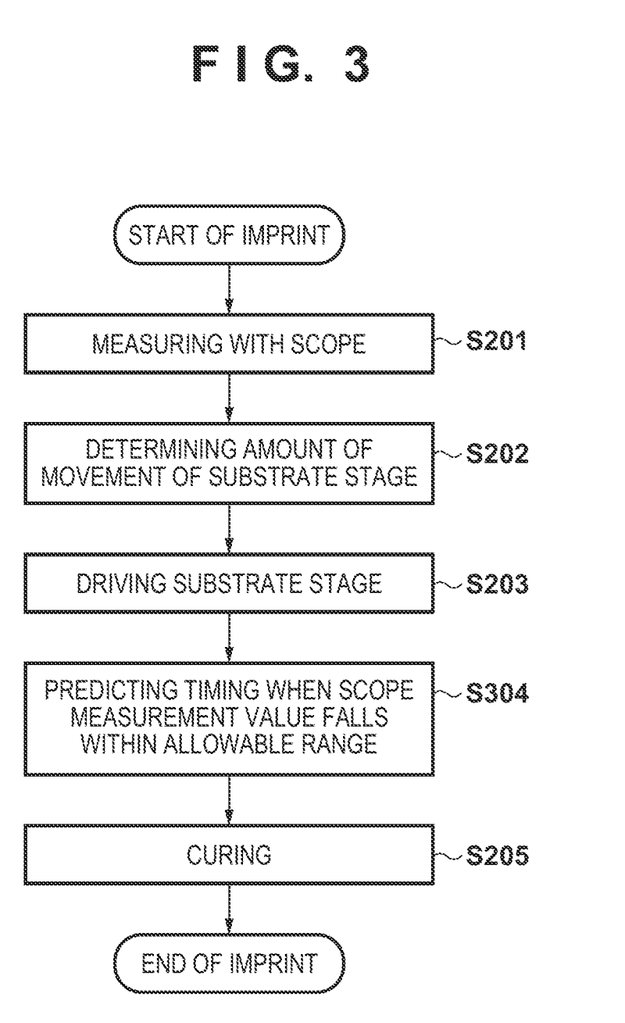
FIG. 3 is a flowchart for illustrating an imprint method of a variation.

In FIG. 3, a variation example of FIG. 2 is illustrated. The same reference numerals are assigned to processing steps that are the same as in FIG. 2 and explanation thereof is omitted. In the variation, the timing at which to start curing of the imprint material is predicted based on the change in the positional deviation detected by the detectors 15, and curing of the imprint material is started at the predicted timing. Here, after driving the substrate stage 14 in step S203, the timing at which to start the curing of step S205 is determined by predicting, in step S304, the timing at which the scope measurement value will fall within the allowable range.

Figure 6:
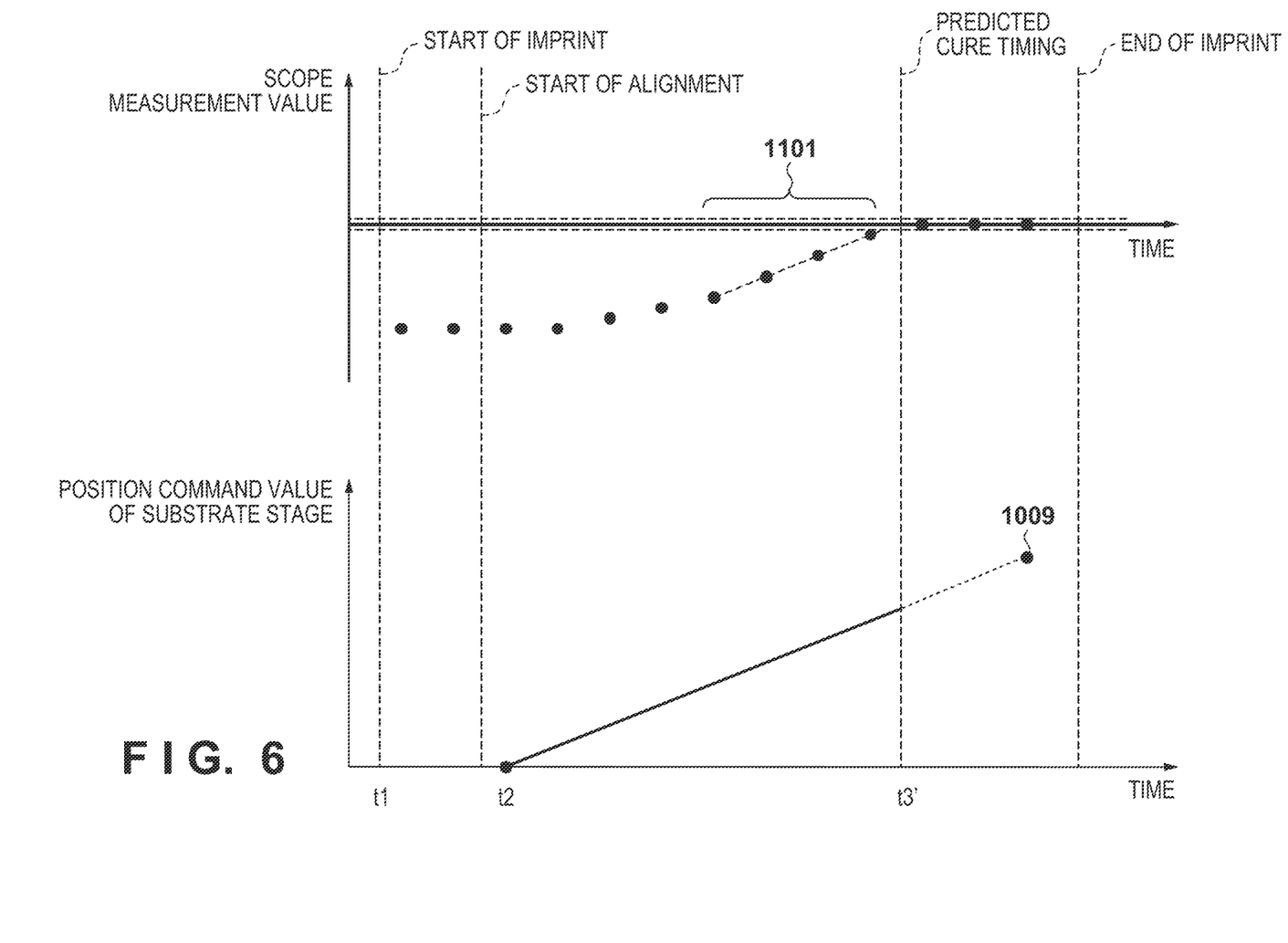
FIG. 6 is a temporal sequence view for describing an imprint alignment process according to a variation.

A concrete example will be described with reference to FIG. 6. After driving of the substrate stage 14 towards the target position 1009 is started at the time t2, the controller 10 sets a temporal section for indicating a change that can be predicted for the scope measurement value (a correlative relationship that can be predicted in relation to the position command value for the substrate stage) to be a curing timing prediction section 1101. The controller 10, based on the scope measurement value, predicts the timing at which the mold 11 and the substrate 13 will be in the ideal positional relationship during the curing timing prediction section 1101. Then, the controller 10, at the predicted timing t3', cures the imprint material by irradiating the ultraviolet light from the irradiator 5.

The movement of the substrate stage 14 in step S203 may be a linear movement of the substrate stage 14 towards the target position 1009, and configuration may be such that sinusoidal driving is performed, for example. In a case where a linear movement of the substrate stage 14 is performed, it is possible to predict, in step S304, the timing at which the scope measurement value will fall within the allowable range when the scope measurement values are linear with respect to the position command values of the substrate stage 14. Also, driving the substrate stage 14 sinusoidally means that the foregoing linear movement of the substrate stage 14 will be reciprocated (reciprocal movement). In such a case, it is possible to predict, in step S304, the timing at which the scope measurement value will fall within the allowable range if the scope measurement values are sinusoidal according to a reciprocal movement with a fixed delay. Furthermore, in the case where the substrate stage 14 is driven sinusoidally, it is possible to repeatedly perform the timing prediction of step S304, and it becomes possible to predict the curing start timing at higher precision.

Figure 4:
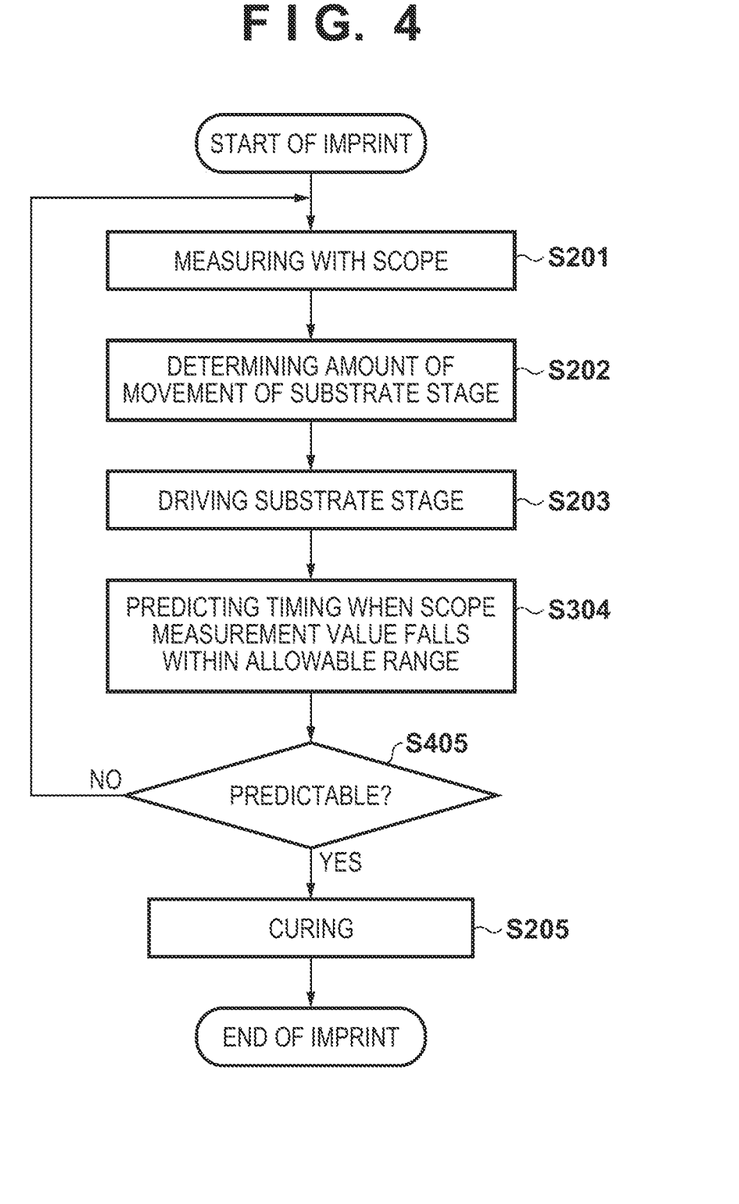
FIG. 4 is a flowchart for illustrating an imprint method of a variation.

In FIG. 4, a variation example of FIG. 3 is illustrated. Here, a determination step S405, which is for determining whether or not it is possible to predict the curing start timing based on a change in a positional deviation detected by the detector 15, is inserted between step S304 and step S205. In step S405, for example, in a case where the scope measurement value does not exhibit a linear change or a periodic change and fluctuates irregularly, it is determined that a correct prediction in step S304 of the timing at which the scope measurement value will fall within the allowable range is impossible. In a case (NO in step S405) in which it is determined that prediction in step S304 of the timing at which the scope measurement value will fall within the allowable range is impossible, step S201 is returned to, and the processing is repeated until it is determined that it prediction is possible in step S405. Accordingly, in this variation, movement of the substrate stage 14 is repeated until it is determined that it is possible to predict the timing at which to start curing. By this, it is possible to reliably predict, in step S304, the timing at which the scope measurement value will fall within the allowable range.

Also, in step S203 in which the substrate stage 14 is driven in FIG. 3 and FIG. 4, the controller 10 can independently control each component of movement in the X-axis direction, movement in the Y-axis direction, and rotation about the Z axis (θz) in the movement of the substrate stage 14. Here, the controller 10 may start driving the substrate stage 14 simultaneously for multiple axes (X, Y, θz). Alternatively, in the case where there is a temporal misalignment in the timing at which the scope measurement value will become optimal for each of the multiple axes (X, Y, θz), the timing at which to start driving of each component may be adjusted separately rather than simultaneously starting driving of the multiple axes. In this case, in step S304, the timing at which the scope measurement value will fall within the allowable range is predicted for each of the multiple axes (X, Y, θz). Note that in step S202, if a movement amount for the substrate stage is determined to be optimal for each of the multiple axes (X, Y, θz), it is possible to start driving of the substrate stage simultaneously for the multiple axes in step S203. Consequently, it is possible to put the relative position between the mold and the substrate in an optimal state for multiple axes.

Also, in the present embodiment, as described in FIG. 5, the controller 10 determines the target position 1009 obtained by applying a predetermined additional amount to the movement amount of the substrate stage 14 according to the positional deviation detected by the detector 15. Adjustment may be made so that gradually this predetermined additional amount is made smaller while repeating the imprint process for imprinting to the shot region. For example, in the imprint process for imprinting to the first shot region, a time difference between an anticipated time at which the substrate stage 14 will arrive at the target position 1009 and the curing start timing t3 that is predicted is calculated. Then, in the imprint process for imprinting to a second shot region, the predetermined additional amount is made smaller so that the time difference therebetween becomes shorter. In this way, the controller 10 may adjust a predetermined additional amount based on the curing start timing determined in the imprint process performed in another shot region different to the target shot region.

Embodiment of Article Manufacturing Method

A pattern of a cured material formed by using an imprint apparatus is used permanently for at least some of various articles, or is used temporarily when manufacturing various articles. The articles include an electric circuit element, an optical element, a MEMS, a recording element, a sensor, and a mold. Examples of the electric circuit element are a volatile or nonvolatile semiconductor memory such as a DRAM, an SRAM, a flash memory, or an MRAM and a semiconductor element such as an LSI, a CCD, an image sensor, or an FPGA. An example of the mold is an imprinting mold.

The pattern of a cured material is used unchanged as a constituent member for at least some of the foregoing articles, or is temporarily used as a resist mask. The resist mask is removed after etching, ion implantation, or the like is performed in a substrate processing step.

Next, the article manufacturing method will be described. In step SA of FIG. 7, a substrate 1z which is a silicon substrate or the like on whose surface a processing target material 2z such as an insulator is formed is prepared, and next, an imprint material 3z is applied to the surface of the processing target material 2z by an ink-jet method. A state in which the imprint material 3z in the form of a plurality of droplets is applied onto the substrate is shown here.

Figure 7:
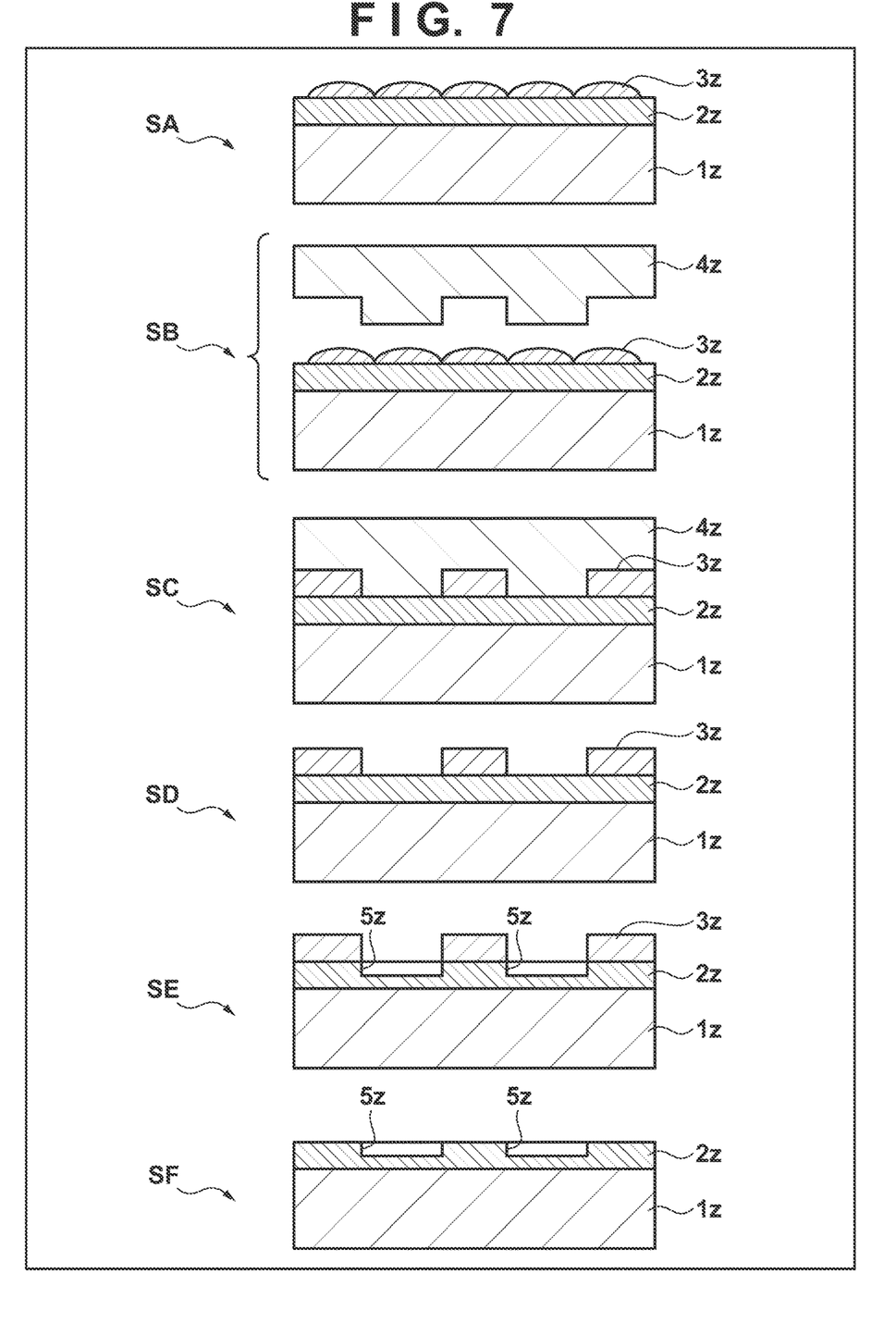
FIG. 7 is a view for describing an article manufacturing method in the embodiment.

As shown in step SB of FIG. 7, a side of an imprinting mold 4z on which its three-dimensional pattern is formed faces the imprint material 3z on the substrate. In step SC of FIG. 7, the substrate 1z to which the imprint material 3z has been applied and the mold 4z are brought into contact, and pressure is applied. Gaps between the mold 4z and the processing target material 2z is filled with the imprint material 3z. When the imprint material 3z is irradiated with light as curing energy through the mold 4z in this state, the imprint material 3z is cured.

In step SD of FIG. 7, when the mold 4z and the substrate 1z are separated after the imprint material 3z is cured, a pattern of the cured material of the imprint material 3z is formed on the substrate 1z. The pattern of this cured product has a shape such that the concave portion of the mold corresponds to the convex portion of the cured product, and the convex portion of the mold corresponds to the concave portion of the cured product; that is, the three-dimensional pattern of the mold 4z is transferred to the imprint material 3z.

In step SE of FIG. 7, when the pattern of the cured material is etched as an etching resistant mask, portions out of the surface of the processing target material 2z where the cured material is not present or thinly remains are removed, and grooves 5z are achieved. In step SF of FIG. 7, when the pattern of the cured material is removed, it is possible to achieve an article in which the grooves 5z are formed on the surface of the processing target material 2z. The pattern of the cured product is removed here; however, the pattern of the cured product may be used as, for example, an interlayer dielectric film included in the semiconductor element or the like, that is, the constituent member of the article without removing it after processing.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-023406, filed Feb. 13, 2018, which is hereby incorporated by reference herein in its entirety.

What is claimed is:

1. An imprint apparatus operable to perform an imprint process, which is for forming a pattern on an imprint material on a substrate by using a mold, for each of shot regions of the substrate, the apparatus comprising:
   a movable stage configured to hold the substrate;
   a detector configured to detect a positional deviation between the mold and the substrate;
   a curing device configured to cure an imprint material on the substrate; and
   a controller configured to control alignment between the mold and the substrate and to control the curing device,
   wherein the controller is configured to:
   determine a target position based on the positional deviation detected by the detector;
   start control of movement of the stage towards the determined target position without feeding back detection results of the detector;
   obtain a change in the positional deviation between the mold and the substrate detected by the detector while the stage is being moved towards the determined target position without feeding back the detection results of the detector, and predict, while the stage is being moved towards the determined target position without feeding back the detection results of the detector, a timing at which the positional deviation between the mold and the substrate will fall within an allowable range based on the obtained change in the positional deviation between the mold and the substrate detected by the detector while controlling the movement of the stage towards the determined target position without feeding back the detection results of the detector; and
   start curing of the imprint material by the curing device at the timing predicted while the stage is being moved towards the determined target position without feeding back the detection results of the detector,
   wherein the movement of the stage is performed in a state where the mold and the imprint material on the substrate are in contact with each other.

2. The imprint apparatus according to claim 1, wherein the movement of the stage is a linear movement towards the target position or a reciprocal movement of the linear movement.

3. The imprint apparatus according to claim 1, wherein the controller is configured to determine whether or not the prediction based on the change is possible, and repeat the movement until it is determined that the prediction is possible.

4. The imprint apparatus according to claim 1, wherein
   in a case where an X axis and a Y axis are directions that are orthogonal to one another in a plane parallel to a surface of the substrate, and a Z axis is a direction orthogonal to the X axis and the Y axis,
   the controller is configured to independently control each component of movement in the X-axis direction, movement in the Y-axis direction, and rotation about the Z axis in movement of the stage.

5. The imprint apparatus according to claim 4, wherein the controller is configured to start driving simultaneously for each component of the movement in the X-axis direction, the movement in the Y-axis direction, and the rotation about the Z axis in movement of the stage.

6. The imprint apparatus according to claim 4, wherein the controller is configured to, for each component of the movement in the X-axis direction, the movement in the Y-axis direction, and the rotation about the Z axis in movement of the stage, predict a timing at which the positional deviation detected by the detector will fall within the allowable range, and adjust the timing at which to start driving for each component based on the respective predicted timings.

7. The imprint apparatus according to claim 1, wherein the controller is configured to determine the target position by adding a predetermined additional amount to a movement amount of the stage according to the positional deviation detected by the detector, and
   wherein the controller is configured to adjust the predetermined additional amount based on the timing determined in the imprint process performed in another shot region different to a target shot region.

8. An article manufacturing method comprising:
   using an imprint apparatus to form a pattern on a substrate;
   processing the substrate on which the pattern has been formed; and
   manufacturing an article from the processed substrate,
   wherein the imprint apparatus is operable to perform an imprint process, which is for forming a pattern on an imprint material on the substrate by using a mold, for each of shot regions of the substrate, the imprint apparatus comprises:
   a movable stage configured to hold the substrate;
   a detector configured to detect a positional deviation between the mold and the substrate;
   a curing device configured to cure an imprint material on the substrate; and
   a controller configured to control alignment between the mold and the substrate and to control the curing device, wherein the controller is configured to:
determine a target position based on the positional deviation detected by the detector;
start control of movement of the stage towards the determined target position without feeding back detection results of the detector;
obtain a change in the positional deviation between the mold and the substrate detected by the detector while the stage is being moved towards the determined target position without feeding back the detection results of the detector, and predict, while the stage is being moved towards the determined target position without feeding back the detection results of the detector, a timing at which the positional deviation between the mold and the substrate will fall within an allowable range based on the obtained change in the positional deviation between the mold and the substrate detected by the detector while controlling the movement of the stage towards the determined target position without feeding back the detection results of the detector; and
start curing of the imprint material by the curing device at the timing predicted while the stage is being moved towards the determined target position without feeding back the detection results of the detector,
wherein the movement of the stage is performed in a state where the mold and the imprint material on the substrate are in contact with each other.

9. The imprint apparatus according to claim 1, wherein the controller is configured to determine the target position by adding a predetermined additional amount to a movement amount of the stage according to the positional deviation detected by the detector.

10. The imprint apparatus according to claim 1, wherein the controller is configured to predict the timing at which the positional deviation between the mold and the substrate will fall within the allowable range based on a plurality of measurement values (i) that are obtained by the detector while controlling the movement of the stage towards the determined target position without feeding back the detection results of the detector and (ii) that exhibit a linear change.

11. The imprint apparatus according to claim 1, wherein the controller is configured to predict the timing at which the positional deviation between the mold and the substrate will fall within the allowable range based on a plurality of measurement values (i) that are obtained by the detector while controlling the movement of the stage towards the determined target position without feeding back the detection results of the detector and (ii) that exhibit a periodic change.

* * * * *